United States Patent [19]

DiFranco et al.

[11] Patent Number: 5,215,645
[45] Date of Patent: Jun. 1, 1993

[54] ELECTRODEPOSITED FOIL WITH CONTROLLED PROPERTIES FOR PRINTED CIRCUIT BOARD APPLICATIONS AND PROCEDURES AND ELECTROLYTE BATH SOLUTIONS FOR PREPARING THE SAME

[75] Inventors: Dino F. DiFranco, Mayfield Village; Sidney J. Clouser, Chardon, both of Ohio

[73] Assignee: Gould Inc., Eastlake, Ohio

[21] Appl. No.: 406,894

[22] Filed: Sep. 13, 1989

[51] Int. Cl.$^5$ ................................................ C25D 1/04
[52] U.S. Cl. ........................................ 205/77; 428/544
[58] Field of Search .......................... 204/12, 13, 52.1; 428/544, 606

[56] References Cited

U.S. PATENT DOCUMENTS 2,563,360  8/1951  Phillips et al. .................. 204/52
3,923,109 12/1966  Luce et al. ...................... 161/166

FOREIGN PATENT DOCUMENTS 52-33074 12/1977 Japan .
63-310989 12/1988 Japan .
63-310990 12/1988 Japan .

OTHER PUBLICATIONS

Ibl et al, *Electrochimica Acta*, 1972, vol. 17, pp. 733–739.
Knuutila, et al. "The Effect of Organic Additives on the Electrocrystallization of Copper", 1987, pp. 129–143.
Bucci, et al. "Foil Technology for PCB Fabrication: Foil Manufacturing & Developement for Advanced PCB Designs", presented at PCFAC EXPO '86 (May 12, 1986).
Afifi, et al, *Journal of Metals*, Feb. 1987, pp. 38–41.
Franklin, *Surface and Coating Technology*, 30, (1987) pp. 415–428.
Chia, et al, *Journal of Metals*, Apr. 1987, pp. 42–45.

Primary Examiner—T. M. Tufariello
Attorney, Agent, or Firm—Renner, Otto, Boisselle & Sklar

[57] ABSTRACT

Copper conductive foil for use in preparing printed circuit boards is electrodeposited from an electrolyte solution containing copper ions, sulphate ions, animal glue and thiourea. The thiourea operates to decrease the roughness of the foil, to enable operation at higher current densities and/or to modify the ductility characteristics of the foil.

31 Claims, 3 Drawing Sheets

ELECTRODEPOSITED FOIL WITH CONTROLLED PROPERTIES FOR PRINTED CIRCUIT BOARD APPLICATIONS AND PROCEDURES AND ELECTROLYTE BATH SOLUTIONS FOR PREPARING THE SAME

BACKGROUND OF THE INVENTION

1. Field of the Invention

The present invention relates to etchable copper conductive foils useful for preparing printed circuit boards and particularly to electrodeposition procedures and electrolyte bath solutions for controlling the properties of such foils. More specifically the invention relates to procedures and electrolyte bath solutions useful for controlling foil properties such as roughness, elongation, tensile strength and ductility. By controlling these properties the electrodeposition operation may be conducted with greater efficiency.

2. Description of the Prior Art

Printed circuit board (PCB) components have become widely used in a variety of applications for radios, televisions, computers, etc. Of particular interest are multi-layer PCB laminates which have been developed to meet the demand for miniaturization of electronic components and the need for PCBs having a high density of electrical interconnections and circuitry. In the manufacture of PCBs, raw materials, including conductive foils, which are usually copper foils, and dielectric supports comprising organic resins and suitable reinforcements, are packaged together and processed under temperature and pressure conditions to produce products known as laminates. The laminates are then used in the manufacture of PCBs. In this endeavor the laminates are processed by etching away portions of the conductive foil from the laminate surface to leave a distinct pattern of conductive lines and formed elements on the surface of the etched laminate. Laminates and/or laminate materials may then be packaged together with etched products to form multi-layer circuit board packages. Additional processing, such as hole drilling and component attaching, will eventually complete the PCB product.

With multiple-layer circuit boards, it may be appreciated that variations in the thickness of the copper foil will lead to nonuniformities of transmission line characteristics within the foil and result in unpredictable electrical characteristics for any given PCB. As the integrated circuits increase in speed, the problem becomes more serious. The dielectric constant and thickness of the substrate along with the height, width, spacing and length of the conductive traces determine many of the electrical performance characteristics of the PCB.

The PCB industry's push toward miniaturization and increased performance per package is resulting in conductors of ever smaller widths, more closely spaced on thinner substrates. The increase in switching frequency of solid state electronic devices that are interconnected by the copper traces, results in further demands on the PCB due to the "skin effect" which results during high frequency operation along a conductor. The characteristics of the copper foil have a significant effect on the electrical performance of the finished PCB. The metallurgical properties of the copper foil are also important in the PCB production process. For example, a foil used in multi-layer laminates must not crack during hole drilling. Also, foils which are less susceptible to wrinkling during the lamination process are preferable for reducing scrap losses.

The production of copper foil by electrodeposition processes involves the use of an electroforming cell (EFC) consisting of an anode and a cathode, an electrolyte bath solution, generally containing copper sulphate and sulphuric acid, and a source of current at a suitable potential. When voltage is applied between the anode and cathode, copper deposits on the cathode surface.

The process begins by forming the electrolyte solution, generally by dissolving (or digesting) a metallic copper feed stock in sulphuric acid. After the copper is dissolved the solution is subjected to an intensive purification process to ensure that the electrodeposited foil contains no disruptions and/or discontinuities. Various agents for controlling the properties may be added to the solution.

The solution is pumped into the EFC and when voltage is applied between the anode and cathode, electrodeposition of copper occurs at the cathode. Typically, the process involves the use of rotatable cylindrical cathodes (drums) that may be of various diameters and widths. The electrodeposited foil is then removed from the cylindrical cathode as a continuous web as the cathode rotates. The anodes typically are configured to conform to the shape of the cathode so that the separation or gap therebetween is constant. This is desirable in order to produce a foil having a consistent thickness across the web. Copper foils prepared using such conventional electrodeposition methodology have a smooth shiny (drum) side and a rough or matte (copper deposit growth front) side. Conventionally such foils are bonded to dielectric substrates to provide dimensional and structural stability thereto, and in this regard, it is conventional to bond the matte side of the electrodeposited foil to the substrate so that the shiny side of the foil faces outwardly from the laminate. In a commercial sense, useful dielectric substrates may be prepared by impregnating woven glass reinforcement materials with partially cured resins, usually epoxy resins. Such dielectric substrates are commonly referred to as prepregs.

In preparing laminates, it is conventional for both the prepreg material and the electrodeposited copper foil material to be provided in the form of long webs of material rolled up in rolls. The rolled materials are drawn off the rolls and cut into rectangular sheets. The rectangular sheets are then laid-up or assembled in stacks of assemblages. Each assemblage may comprise a prepreg sheet with a sheet of foil on either side thereof, and in each instance, the matte side of the copper foil sheet is positioned adjacent the prepreg so that the shiny sides of the sheets of foil face outwardly on each side of the assemblage.

The assemblage may be subjected to conventional laminating temperatures and pressures between the plates of laminating presses to prepare laminates comprising sandwiches of a sheet of prepreg between sheets of copper foil.

The prepregs used conventionally in the art may consist of a woven glass reinforcement fabric impregnated with a partially cured two-stage resin. By application of heat and pressure, the matte side of the copper foil is pressed tightly against the prepreg and the temperature to which the assemblage is subjected activates the resin to cause curing, that is cross linking of the resin and thus tight bonding of the foil to the prepreg dielectric substrate. Generally speaking, the laminating operation will involve pressures in the range of from about 250 to about 750 psi, temperature in the range of from about 350° to 450° F. and a laminating cycle of from about 40 minutes to about 2 hours. The finished laminate may then be utilized to prepare PCBs.

Conductive foils for PCB applications are conventionally treated, at least on the matte side, for enhanced bonding and peel strength between the matte side and the laminate Typically the foil treatment involves treatment with a bonding material to increase surface area and thus enhance bonding and increase peel strength. The foil may also be treated to provide a thermal barrier, which may be brass, to prevent peel strength from decreasing with temperature. Finally, the foil may be treated with a stabilizer to prevent oxidation of the foil. These treatments are well known and further description thereof is not necessary at this point.

A number of manufacturing methods are available for preparing PCBs from laminates. Additionally, there is a myriad of possible end use applications. These methods and end uses are known and need not be discussed in detail here. But suffice it to say that each method and each end use has its own set of idiosyncracies which often may dictate the physical and/or chemical characteristics of the foil itself. Thus, the industry has established a set of definitions and has defined eight separate categories or classes of copper foil. These definitions and the characteristics of each of the eight classes of foil are set out in a publication of the Institute for Interconnecting and Packaging Electronic Circuits (IPC) entitled "Copper Foil for Printed Wiring Applications" and designated IPC-CF-150X.

The document IPC-CF-150X, where X denotes, in alphabetical order, the various revisions, contains the specifications for the acceptable technical properties and performance of copper foils for the manufacture of printed circuits. This document in its entirety is contained in military specification MIL-P-13949 for polymeric dielectric laminates and bonding sheets to be used in the production of printed circuit boards. Therefore, certification of foils to the IPC-CF-150X standards automatically ensures qualification to military specification standards.

The current IPC publication is Revision E published May, 1981 and designated IPC-CF-150E and this publication is hereby specifically incorporated herein by reference.

IPC-CF-150E sets forth the following table which defines the minimum values for certain mechanical properties for each class of foil

TABLE 1

Mechanical Properties (Minimum Values)
(The copper foil shall conform to the tensile and elongation requirements when tested in both longitudinal and transverse directions.)

| Copper Type and Class | | Copper** Weight oz. | AT ROOM TEMPERATURE 23° C. | | | | AT ELEVATED TEMPERATURE 180° C. | | |
|---|---|---|---|---|---|---|---|---|---|
| | | | Tensile Strength | | % DUCTILITY | | Tensile Strength | | % Elongation (2.0" G.L.) |
| | | | Lbs./In.$^2$ | Mega Pascals (MPa) | Elong. (2.0" G.L.) CHS 2"/Minute | Fatigue Ductility | Lbs./In.$^2$ | Mega Pascals (MPa) | CHS 0.05"/Minute |
| TYPE E | 1 | ½ | 15,000 | 103.35 | 2.0 | Not developed | NOT APPLICABLE | | |
| | | 1 | 30,000 | 206.70 | 3.0 | | | | |
| | | 2+ | 30,000 | 206.70 | 3.0 | | | | |
| | 2 | ½ | 15,000 | 103.35 | 5.0 | Not developed | NOT APPLICABLE | | |
| | | 1 | 30,000 | 206.70 | 10.0 | | | | |
| | | 2+ | 30,000 | 206.70 | 15.0 | | | | |
| | 3 | ½ | 15,000 | 103.35 | 2.0 | Not developed | — | — | — |
| | | 1 | 30,000 | 206.70 | 3.0 | | 20,000 | 137.80 | 2.0 |
| | | 2+ | 30,000 | 206.70 | 3.0 | | 25,000 | 172.25 | 3.0 |
| | 4 | — | — | — | — | Not developed | — | — | — |
| | | 1 | 20,000 | 137.80 | 10.0 | | 15,000 | 103.35 | 4.0 |
| | | 2+ | 20,000 | 137.80 | 15.0 | | 15,000 | 103.35 | 8.0 |
| TYPE W | 5 | ½ | 50,000 | 344.50 | 0.5 | 30.0 | — | — | — |
| | | 1 | 50,000 | 344.50 | 0.5 | | 20,000 | 137.80 | 2.0 |
| | | 2+ | 50,000 | 344.50 | 1.0 | | 40,000 | 375.60 | 3.0 |
| | 6 | 1 | 25,000 to 50,000* | 172.25 to 344.50 | 1.0 to 20.0 | 30.0 to 65.0 | NOT APPLICABLE | | |
| | | 2+ | according to temper | according to temper | according to temper | according to temper | | | |
| | 7 | ½ | 15,000 | 103.35 | 5.0 | 65.0 | — | — | — |
| | | 1 | 20,000 | 137.80 | 10.0 | | 14,000 | 96.46 | 6.0 |
| | | 2+ | 25,000 | 172.25 | 20.0 | | 22,000 | 151.58 | 11.0 |
| | * | ½ | 15,000 | 103.35 | 5.0 | 25.0 | NOT APPLICABLE | | |
| | 8 | 1 | 20,000 | 137.80 | 10.0 | | | | |

*Properties given are following a time/temperature exposure of 15 minutes at 177° C. (350° F.).
**Minimum properties for testing copper weights less than ½ ounce shall be agreed to between user and vendor.

Of the classes of foil defined by IPC-CF-150E, perhaps the most widely used by the industry is IPC Class 1 which is sometimes referred to simply as standard foil. IPC Class 1 foil is an electrodeposited foil that has a generally acceptable room temperature ductility characteristics Another class of foil that is widely used by the industry is IPC Class 3 foil which is also sometimes referred to as high elevated temperature ductility foil. IPC Class 3 foil is an electrodeposited foil that has high ductility at elevated temperatures and thus is able to withstand the stresses and strains imposed particularly at thru holes by differential thermal expansion during soldering operations and in high temperature use applications.

Copper foils have been produced for PCB use by two major methods, rolling or electrodeposition. The invention of the present application relates to the latter. As set forth above, to produce copper foil by electrodeposition, a voltage is imposed between an anode and a cathode immersed in a copper containing electrolytic bath solution. Copper is electrodeposited on the cathode in the form of a thin metal film. The qualities and characteristics of the metal film are a function of many parameters such as current density, temperature, substrate material, solution agitation and electrolyte solution composition. Additives are often placed in the electrolyte solution so that the electrodeposit may be formed with certain desired qualities, a main one of which is a certain controlled roughness. Without the presence of additives the copper deposits have the tendency, as a result of crystalline imperfections and grain boundaries, to grow with an uncontrolled roughness that is not uniform. Additionally, a certain controlled degree of roughness is often desired by the copper foil user so that the bond strength is increased between the copper foil and the dielectric support to which the copper foil is adhered, and the copper foil. Roughness contributes to the strength of the bond by increasing the surface area available for bonding.

A gelatine component may often be included in the electrolyte solution to control roughness. The gelatine component most commonly used is animal glue. Glue is believed to function by adsorbing onto the electroplating surface to thus decrease the exchange current density for copper deposition, a condition found in the theories of electrodeposition to be favorable to production of smoother deposits.

According to known methodology, copper foil may be electrodeposited from an electrolyte solution containing about 100 grams per liter (g/l) of copper, about 80 g/l of sulphuric acid and about 80 parts per million (ppm) of chloride ions. Glue may be added to the solution during electrodeposition at addition rates ranging from about ½ milligram of glue per minute per 1,000 amperes (mg/min.kA) up to about 11 mg/min kA. The process generally was conducted at a temperature of about 60 degrees centigrade (°C.) using a current density between about 200 and about 1,400 amperes per square foot (ASF). It has been determined that the roughness of the matte surface of the deposited copper foil generally increases as the glue addition rate is decreased and/or the current density is increased. Electrolyte flow is maintained so that plating occurs below the mass transfer limited current density. In such process the glue addition rate may be varied to vary the metallurgical properties of the copper foil to meet various performance criteria. Typical matte side roughnesses ($R_{tm}$) of copper foils produced by this method, as measured on a Surftronic 3 profilometer (Rank Taylor Hobson Ltd.—Leicester, England), range from about 4.75 μm to about 8 μm for ½ oz. copper foil; from about 6.5 μm to about 10 μm for 1 oz copper foil; and from about 8.75 μm to about 15 μm for 2 oz. copper foil. IPC Class 1 foils were produced by this method at glue addition rates between 5 and 11 mg/min kA while IPC Class 3 foils were produced at glue addition rates less than 5 mg/min.kA. Low profile (low roughness) foils could be produced by increasing the glue addition rate to above 11 mg/min kA.

One disadvantage of the known method is that as the copper foil is deposited to greater thicknesses, the roughness increases and the number of isolated roughness elements also increases. The isolated roughness elements may be separated by interspersed smooth areas, rendering the copper foil unusable for some critical electronic applications. To minimize such roughness increases, the current must be decreased, resulting in lost production capacity. Another disadvantage of the known methodology is that copper foils with lower matte side roughnesses (low profile foils) were not readily obtainable without corresponding decreases in metallurgical qualities, such as in elevated temperature elongation Thus, low profile IPC Class 3 foils generally could not be produced by the known methods without substantial loss of efficiency. In this regard, the lowest $R_{tm}$ achievable using known methods for producing IPC Class 3 foils was approximately 11 to 12 μm for 2 oz. foil, approximately 7 to 8 μm for 1 oz. foil, and approximately 5 to 6 μm for ½ oz. foil. Furthermore, the lowest $R_{tm}$ achievable using the known methods for producing Class 1 foils was approximately 5.2 μm for 2 oz. foil, about 5 μm for 1 oz. foil, and about 4.6 μm for ½ oz. foil. On the other hand, low profile foils having a $R_{tm}$ below about 4.5 μm have sometimes become desirable because they provide finer line definition, better impedance control and reduced propagation delays. In particular low profile foils are desirably used to facilitate tape automated bonding operations. In general, low roughness facilitates the use of less resin in bonding the foil to a dielectric substrate as well as the use of thinner laminates.

The prior art processes described above and which have utilized glue in an attempt to control properties such as roughness and ductility, have suffered from several distinct and difficult disadvantages. Firstly, when the process was used to make standard IPC Class 1 foils, the overall efficiency of the process was limited by the fact that increases in current density (ASF) were generally accompanied by increases in roughness and decreases in ductility. Secondly, to decrease roughness and produce low profile foils it was necessary to increase the glue addition rate; however, an increased glue addition rate resulted in decreased ductility. So it was necessary to reduce the current density to counteract the loss of ductility. Finally, to produce a suitable IPC Class 3 foil it was necessary to decrease the glue addition rate, but this caused an increase in roughness. So in this case it was also necessary to reduce the current density to counteract the increased roughness.

It was generally known in the copper electrorefining industry that surface active agents could be used to produce bulk copper cathodes having smoother surfaces. The smoother surfaces are desirable in the refining industry from the standpoint of plant efficiency. The copper cathodes in a refining plant are deposited to substantial thicknesses, i.e., many millimeters. As the deposit grows to such thicknesses, the cathode becomes rougher, and in extreme cases, dendrites and nodules form on the cathodes causing shorts in the cells. When such shorting occurs plating ceases. To maintain the plating output, the cathode must be changed before a short occurs. In order to minimize the number of cathode changes and to deposit a greater thickness of copper for each cathode, the electrorefining industry has used addition agents such as animal glue, chloride ion and thiourea to reduce dendrite and nodule formation on the copper cathodes.

The electrorefining industry has sought to prepare higher quality copper cathodes, for instance, for use as raw material in super-fine copper wire. E. H. Chia et al., "Organic Additives: A Source of Hydrogen in Copper Cathodes," *Journal of Metals*, April, 1987, pages 42–45. Chia et al. discuss the use of organic additives including combinations of thiourea and glue, in electrorefining copper. Chia et al. specifically address the assumption that thiourea contributes hydrogen at the cathode in the refining tank.

S. E. Afifi et al., "Additive Behavior in Copper Electrorefining," *Journal of Metals*, February, 1987, pages 38–41, also discuss the use of organic additives such as gelatine and thiourea in electrodeposition processes. This paper states that such additives can be used to modify the crystal size of the deposit to improve the brightness of the deposit. The authors conclude that small concentrations of thiourea act beneficially toward surface brightness of deposits up to very high values of current densities, but at higher concentrations of thiourea the surface brightness of deposits decreases rapidly, possibly due to increased precipitation of cupric sulfide or sulphur on the electrode surfaces.

Knuutila et al. "The Effect of Organic Additives on the Electrocrystallization of Copper," *The Electrorefining of Copper*, examine the behavior of thiourea, animal glue and chloride ions in the electrolysis of copper. This paper deals with changes in polarization curves in the electrolysis of copper and indicates that the microstructure of a copper cathode obtained from an electrolyte containing thiourea differs drastically from the microstructure obtained from a bath containing only glue. Specifically, the thiourea field-oriented structure is evident, and the grain size is much finer. Furthermore, animal glue provides a microstructure in deposited copper having a basis-oriented structure.

Ibl et al., "Note on the Electrodeposits Obtained at the Limiting Current," *Electrochimica Acta*, 1972, Vol. 17, pages 733–739, disclose the use of thiourea in acid cupric sulfate solutions as a leveling agent.

Franklin, "Some Mechanisms of Action of Additives in Electrodeposition Processes," *Surface and Coatings Technology*, Vol. 30, pages 415–428, 1987, discusses the use of a number of additives in electrodeposition processes, including one for copper.

While the surface deposit effects of glue and thiourea are thus well known to those skilled in the art of copper electrorefining to produce thick copper deposits, the use of thiourea has not previously been applied in the copper foil industry for controlling process parameters or properties such as surface roughness, tensile strength, elongation and/or ductility of thin copper foils to be used in the PCB industry.

SUMMARY OF THE INVENTION

The present invention addresses the problems outlined above by providing an improvement for the existing electrolytic processes used for forming copper foils for printed circuit board applications. The invention is applicable in connection with processes for electrically forming such copper foils wherein an electrical current is applied between an anode and a cathode in an electrolyte solution containing copper ions, sulfate ions and a gelatine component to cause electrodeposition of copper foil at the cathode. The improvement for such process provided by the invention comprises incorporating into the solution an electrodeposited foil characteristics controlling quantity of an active sulphur containing component. In one sense of the invention the quantity of such active sulphur containing component may be sufficient for decreasing the roughness of the electrodeposited foil. In another sense of the invention the amount of the active sulphur containing component may be sufficient for increasing the tensile strength of the electrodeposited foil. In yet another sense of the invention the amount of active sulphur containing component may be sufficient to enable increase of the current applied between the anode and the cathode without altering the basic characteristics of the foil.

A very important aspect of the invention is that the process provided thereby is capable of achieving production of IPC Class 3 foil having a roughness which is less than that which has been achievable utilizing prior art processes. Additionally, the invention facilitates production of IPC Class 3 foil at higher current densities than have heretofore been achievable.

In accordance with a particular embodiment of the invention the gelatine component may comprise animal glue. In another important embodiment the active sulphur containing component may comprise thiourea. And in a preferred aspect of the invention the animal glue may be added to the electrolyte solution at a rate in the range of from about 0.2 mg/min.kA to about 20 mg/min.kA and the thiourea may be added to the electrolyte solution at a rate in the range of from about 1.25 mg/min.kA to about 50 mg/min.kA.

The invention thus provides a process for preparing a low profile copper foil for printed circuit board applications comprising preparing a copper electrodeposition bath solution containing copper ions, sulphate ions, a gelatine component and a roughness decreasing quantity of an active sulphur containing component, and then cathodically plating copper from the bath solution to provide a foil having a thickness suitable for printed circuit board applications. Again, the active sulphur containing component may be preferably be thiourea.

In another important aspect the invention provides an electrolytic bath for electrodepositing copper foil for printed circuit board applications comprising an aqueous solution containing copper ions, sulphate ions a gelatine component and a roughness decreasing quantity of an active sulphur containing component. In a preferred aspect of the invention the active sulphur containing component may be thiourea and the quantity of thiourea present in the bath may range from about 0.28 ppm to about 11.1 ppm.

The invention also provides an electrolytic bath for electrodepositing copper foil having increased resistance to wrinkling for printed circuit board applications. In this aspect of the invention the bath may comprise an aqueous solution containing copper ions, sulphate ions, a gelatine component and a tensile strength increasing quantity of an active sulphur containing component. The invention also provides a process for preparing a low profile copper foil for printed circuit board applications utilizing a copper electrodeposition bath solution containing copper ions, sulphate ions, a gelatine component and a tensile strength increasing quantity of an active sulphur containing component.

In another important aspect the invention provides a process for preparing an electrodeposited copper foil for printed circuit board applications and having IPC-CF-150E Class 1 or Class 3 properties. In this aspect of the invention the process includes the steps of preparing a copper electrodeposition bath solution comprising copper ions, sulphate ions and gelatine, applying an electrical current to the bath solution to cathodically plate copper therefrom, and including a roughness decreasing quantity of an active sulphur containing component in the solution to thereby facilitate a corresponding increase in the electrical current density.

The invention also provides a process for preparing an electrodeposited copper foil for printed circuit board applications and having IPC-CF-150E Class 1 properties and increased resistance to wrinkling. In this form of the invention the process includes the steps of preparing a copper deposition bath solution comprising copper ions, sulphate ions and gelatine, applying an electrical current to the solution to cathodically plate copper from the solution, and including a tensile strength increasing quantity of an active sulphur containing component in the solution.

The invention also provides an electrolytic bath for electrodepositing low profile copper for printed circuit board applications comprising an aqueous solution containing a gelatine component and a roughness decreasing quantity of an active sulphur containing component. In this embodiment of the invention the electrolytic bath may comprise an acid solution of copper sulfate and sulphuric acid. Additionally, the sulphur containing component may comprise thiourea and the gelatine component may comprise animal glue. The thiourea may be present in the bath solution in an amount ranging from about 0.28 ppm to about 11.1 ppm and the animal glue may be present in the solution in an amount ranging from about 0.044 ppm to 4.4 ppm.

The invention also provides a 2 oz. copper foil for printed circuit board applications having IPC-CF-150E Class 1 properties and an $R_{tm}$ of less than about 8.0 μm. Additionally, the invention provides a 1 oz. copper foil for printed circuit board applications having IPC-CF-150E Class properties and an $R_{tm}$ of less than about 5 μm. Further the invention provides a ½ oz. copper foil for printed circuit board applications having IPC-CF-150E Class 1 properties and an $R_{tm}$ of less than about 4.6 μm. The invention also provides low profile copper foil for printed circuit board applications having IPC-CF-150E Class 3 properties. In this regard, the invention provides a 2 oz. copper foil for printed circuit board applications having IPC-CF-150E Class 3 properties and an $R_{tm}$ of less than about 11 μm, a 1 oz. copper foil for printed circuit board applications having IPC-CF-150E Class properties and an $R_{tm}$ of less than about 7 μm, and a ½ oz. copper foil for printed circuit board applications having IPC-CF-150E Class 3 properties and an $R_{tm}$ of less than about 5 μm.

In a broader respect the invention provides an electrodeposited copper foil having a uniform controlled roughness and/or improved metallurgical properties. In accordance with the invention such copper foil may be produced at higher current densities than are achievable using present technology The invention provides methodology for electrolytically depositing copper foils having high elevated temperature elongation as well as low profile.

In sum the invention provides the methodology for producing low profile foils without a concomitant decrease in the elongation of the foil. Thus, the low profile copper foil may be produced without a corresponding reduction in current density in the electrolytic cell. Additionally, in accordance with the invention standard foil products may be produced at increased current densities without experiencing increased roughness This also facilitates the production of foil products having increased tensile strength and thus enhanced resistance to wrinkling. Finally, the invention provides the methodology for making IPC Class 3 foils at higher current densities as a result of the incorporation of a roughness decreasing quantity of the active sulphur containing component in the electrolytic bath.

DESCRIPTION OF THE PREFERRED EMBODIMENTS

The present invention provides a method for manufacturing copper foil products by electrodeposition wherein a number of important physical properties and characteristics of the foil may be closely controlled. In particular the invention provides for the electrodeposition of copper foil by cathodic electrodeposition from an electrolyte solution containing copper ions, sulphate ions and a gelatine component and to which is added a copper foil characteristics controlling quantity of an active sulphur containing component. The inclusion of the active sulphur containing component, which preferably may be thiourea or some other component having a bivalent sulphur atom, both bonds of which are directly connected to a carbon atom together with one or more nitrogen atoms also directly connected to the carbon atom, provides a mechanism for achieving close control of certain critical characteristics of the electrodepositing foil during the conduct of the electrodepositing operation. By adding such component to the electrolyte solution containing a gelatine component, the roughness, elongation and tensile strength of copper foil may each be manipulated and controlled. As a result it is often also possible to achieve an increase in current density.

Figure 1:
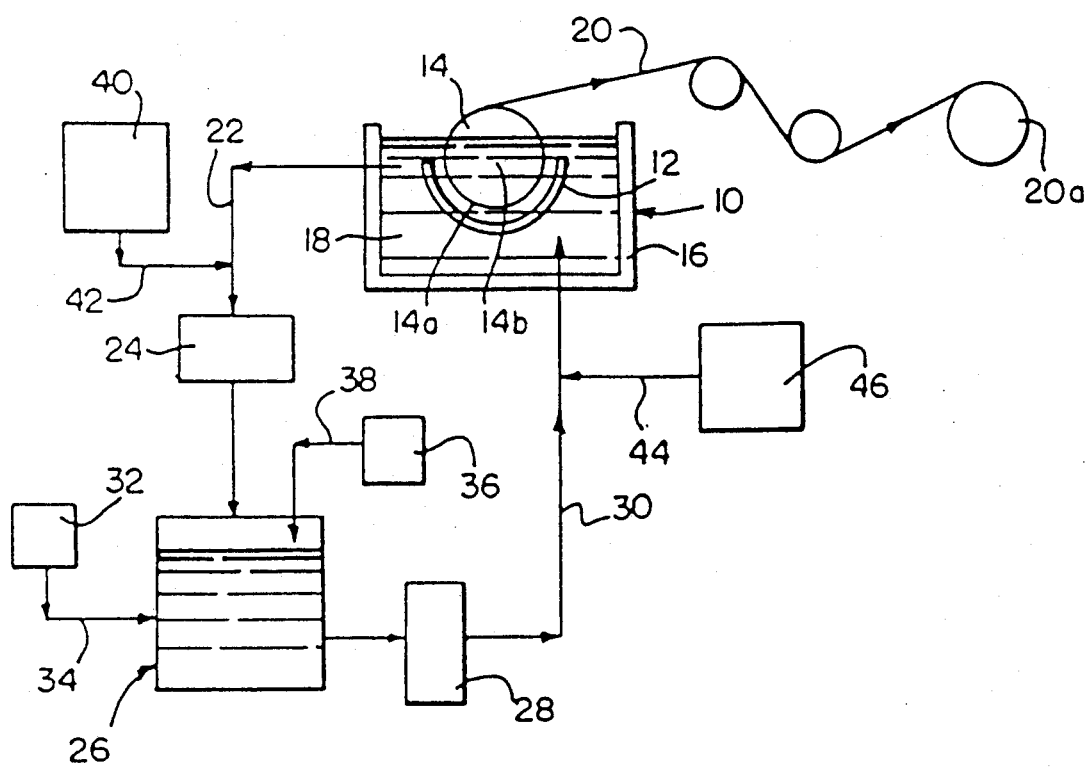
FIG. 1 is a schematic flow diagram illustrating an electroforming cell operable in accordance with the principles and concepts of the invention.

An electroplating operation conducting in accordance with the invention may be carried out in a continuous electroplating system of the sort depicted schematically in FIG. 1 of the drawings. The system includes an electroforming cell (EFC) 10 that comprises an anode 12, a cathode 14, a vessel 16 and an electrolyte solution 18 contained in vessel 16 and in which anode 12 and cathode 14 are suitably submerged.

Solution 18 contains copper ions, sulphate ions, a gelatine component and an active sulphur containing component and means are provided, in a manner that is well known in the art, for applying an electrical current between anode 12 and cathode 14. Thus, copper ions in solution 18 gain electrons at the peripheral surface 14a of cathode 14 whereby metallic copper plates out in the form of a foil layer web 20. Cathode 14 rotates continuously about its axis 14b during the process and foil layer 20 is continuously withdrawn from surface 14a and thus from EPC 10 as a continuous web which is formed into a roll 20a.

The process depletes the eleotrolyte solution of copper ions, sulphate ions, the gelatine component and the active sulphur containing component. And since the process is preferably a continuous process these ingredients must be continuously replenished. To this end solution 18 is withdrawn through line 22 and recirculated through a filter 24, a digester 26 and another filter 28 and then is reintroduced into vessel 16 through line 30. Sulphuric acid from a source 32 is fed into digester 26 through line 34 and metallic copper from a source 36 is introduced into digester 26 as indicated schematically along the path 38. Metallic copper is digested by sulphuric acid to form copper ions in digester 26.

Make-up gelatine component is added to the recirculating solution in line 22 from a source 40 through a line 42. And in accordance with the invention, the active sulphur containing component is added to the recirculating solution in line 30 through line 44 from a source 46. The sulphur containing component is preferably introduced into the recirculating solution at a point as near to the vessel 16 as possible to minimize decomposition of the active sulphur containing component by the highly acidic recirculating fluid existing from digester 26.

Generally speaking, in commercial applications it is difficult, if not impossible, to avoid the presence of chloride ions in the electrolyte solution 18. In this regard, it should be noted that chloride ion is a common contaminant in water and in bulk ingredients. And since the chloride ion concentration has an effect on the properties of the electroplated foil it is desirable to control the chloride ion concentration at a known level to eliminate the uncertainties that would be involved if the chloride ion concentration were to fluctuate unpredictably. In the process of the invention it has been determined that appropriate results are achieved when the chloride ion concentration in the electrolyte is in the range of from about 20 to about 200 ppm, preferably from about 30 to about 100 ppm, and ideally about 80 ppm. The chloride ion content in the electrolyte solution may be controlled by devices that are well known and conventionally employed by those of ordinary skill in the art of production of conductive foils by electroforming processes.

The concentrations of the active sulphur containing component and the gelatine component in the electrolyte solution may preferably be expressed in terms of the steady state consumption rate thereof. These ingredients act at the surface of the copper foil as it forms and are consumed by the reactions which occur there. And they affect the internal regions as well as the external surfaces of the foil and thus have a modifying effect on tensile strength, ductility and elongation in addition to surface roughness.

The consumption rate is determined by the concentration of each ingredient in the electrolyte solution and this is determined by the amount of each ingredient that is added to the electrolyte solution during steady state operation. The addition rate may be expressed in terms of weight added per unit of time per unit of current flow. Conveniently the addition rate of the active sulphur containing component and of the gelatine component may be defined as milligrams added to the electrolyte solution per minute per one thousand amperes (mg/min.kA).

The separate roles of ingredients such as the active sulphur containing component and the gelatine component, particularly in electroforming operations, are discussed in a number of prior literature publications and patents. Active sulphur containing components are discussed and defined in U.S. Pat. No. 2,563,360, the entirety of the disclosure of which is hereby specifically incorporated herein by reference. The '360 patent discloses a number of components that contain active sulphur, including thiourea, which are suitable for use in accordance with the present invention. For purposes of the invention, however, the preferred compound is thiourea because it is readily commercially available and relatively inexpensive and convenient to handle.

Gelatine components are discussed and defined in the E. H. Chia et al. and S. E. Afifi et al. articles cited above. Thus, useful gelatine components are high-protein polymers of amino acids linked by peptide chains, —CO—NH—, and having molecular weights in the range of from about 10,000 to 300,000. Commonly animal glue is used as the gelatine component because it is relatively inexpensive, readily commercially available and convenient to handle.

Thiourea is effectively used as an active sulphur containing additive for an electrolyte solution that also contains both animal glue as a gelatine component and chloride ions and which is used to electrolytically produce copper foil having uniform controlled roughness. As set forth above, the chloride ion level in the solution may preferably be controlled at about 80 ppm. The animal glue itself is often incapable of effectively producing a desired degree of leveling and smoothness of the deposit and the addition of thiourea produces a substantial roughness controlling effect. The lowering of the roughness by the thiourea is thought to occur by a surface adsorption which affects the morphology of the growing deposit front. When thiourea, animal glue and chloride ion are simultaneously present in the electrolyte solution copper foils with a low uniform controlled roughness are produced. It is believed that the glue and chloride may tend to interact with one another to cancel their mutual effects and thus permit the thiourea to have its desired effect.

In accordance with the invention, low profile IPC Class 1 foil may conveniently be produced. When compared with standard IPC Class 1 foils produced without thiourea, the foils produced in accordance with the invention may have lower roughness, slightly elevated tensile strength, slightly lower elongation characteristics and TD and LD properties that are more isotropic. In this latter regard, with reference to the foil web 20 in FIG. 1, TD properties are measured across the web, that is, in a direction parallel to the axis of rotation of cathode drum 14, while LD properties are measured in a direction along the web. And if roughness need not be minimized (that is if standard roughness is acceptable) EFC 10 of FIG. 1 may be operated at increased current densities to thereby increase the commercial output of the process.

Another unexpected benefit achieved through the use of the invention is that the tensile strength of the Class 1 foil may be higher and the modulus of elasticity may also be higher than when animal glue alone is used to control roughness. Such foil having higher tensile strength and higher modulus of elasticity is less susceptible to wrinkling. The net result of this in a commercial application is that less foil will be damaged during processing and waste will thereby be reduced.

EXAMPLE I

Initially, experimentation was conducted using a laboratory system wherein the glue level in the electrolyte solution was maintained at about 2 ppm at all times. The thiourea concentration in the bath solution was maintained at about 0, 1, 2 or 3 ppm. The level of chloride ions in the bath solution was maintained at 50 ppm and the cell was operated at various cathode current densities ranging from 500 to 1500 ASF. 1 oz. copper foil was produced. The results are presented as a bar graph in FIG. 2 and microphotographs of the cross-sections of the four foils produced at 1000 ASF are shown in FIGS. 3A through 3D of the drawings, where 3A shows the cross-section of a foil electrodeposited from an electrolyte bath containing 2 ppm animal glue and 0 ppm thiourea; FIG. 3B shows the cross-section of a foil electrodeposited from a bath containing 2 ppm animal glue and 1 ppm thiourea; FIG. 3C shows the cross-section of a foil electrodeposited from a bath containing 2 ppm animal glue and 2 ppm thiourea; and FIG. 3D shows the cross-section of a foil electrodeposited from a bath containing 2 ppm animal glue and 3 ppm thiourea. The leveling power of the thiourea is clearly evident from FIGS. 3A through 3D.

Figure 2:
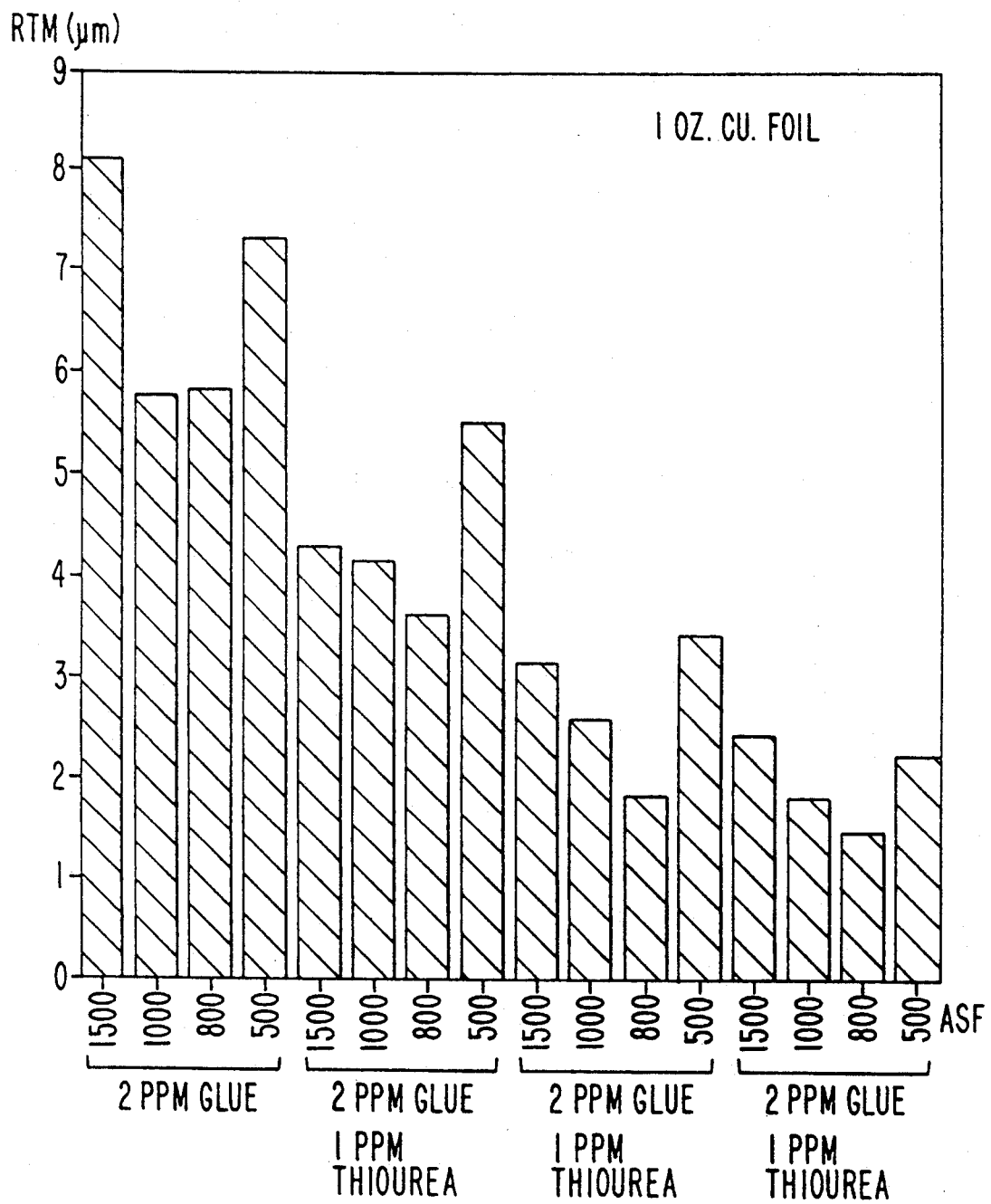
FIG. 2 is a bar graph setting forth data to illustrate benefits achieved through the use of the invention.
Figure 3A:
FIG. 3A, 3B, 3C and 3D are microphotographs illustrating the cross-sectional configurations of foils produced in accordance with the invention.
Figure 3B:
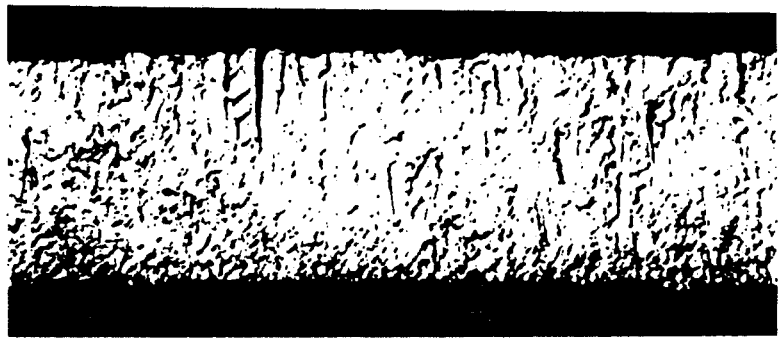
Figure 3C:
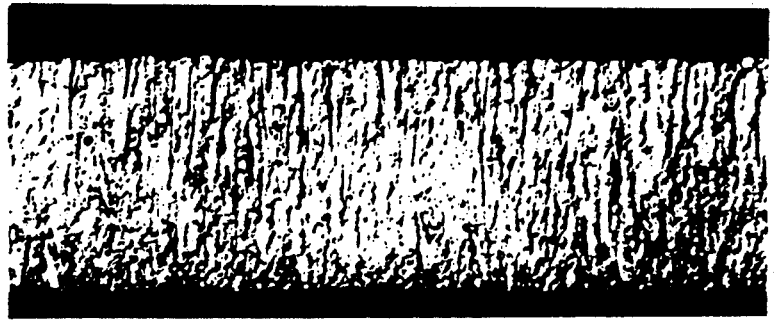
Figure 3D:
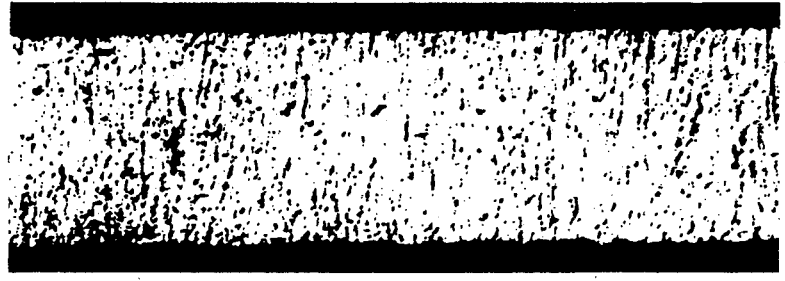

From FIG. 2 it can also be seen that at a 2 ppm concentration of animal glue in the electrolyte bath, the roughness ($R_{tm}$) decreases as the thiourea concentration is increased.

In known electrodeposition operations, a glue concentration in the order of 2 ppm is generally used to produce IPC Class 1 foils. The glue level is increased to reduce roughness and produce low profile foil. And the glue level is decreased to produce IPC Class 3 foils.

In accordance with the present invention, it has been discovered that at glue levels sufficient to produce IPC Class 1 foils, an increase in the level of thiourea results in an increase in tensile strength and decreases in both roughness and elongation. Moreover, it has been discovered that in all cases an increase in current density results in a decrease in elongation and increases in both tensile strength and roughness. Furthermore, it has been determined that an increase in the glue level results in an increase in tensile strength and decreases in both roughness and elongation. Additionally, it has been discovered that at the low glue levels necessary to produce IPC Class 3 foils, the action of thiourea is inverted and in such case the tensile strength of the foil is decreased and the elongation of the foil is increased when the thiourea level is increased. This is highly beneficial for purpose of producing a low profile Class 3 foil.

EXAMPLE II

To investigate the production of Class 1 foil using thiourea in accordance with the invention, a number of test runs were conducted using a production scale electroforming system set up as illustrated in FIG. 1. In all these tests EFC 10 was operated at a current density of 460 amps per square foot of active cathode surface (ASF), glue was added through line 42 at rates of 15.12 mg/min.kA or 9.0 mg/min.kA and thiourea was added through line 44 at rates ranging from 0 to 30 mg/min.kA. In each case a 1 oz. foil was produced In connection with these tests it was discovered that a 9.0 mg/min kA addition rate is appropriate to maintain a bath concentration of roughly about 2 ppm and it is believed that the bath concentration of each additive varies directly with addition rates; however, there is no good method for accurately measuring the concentration of a given component in the bath at any particular moment in time. Accordingly, these correlations, while believed to be appropriate, may not always be completely accurate. The data collected from these tests are set forth in Table 2.

TABLE 2

| Run No. | Glue Addition Rate mg/min · kA | Thiourea Addition Rate mg/min · kA | Roughness ($R_{tm}$) μm | Room temperature (LD) characteristics* | | Room temperature (TD) characteristics* | |
|---|---|---|---|---|---|---|---|
| | | | | T.S. (psi) | % Elong | T.S. (psi) | % Elong |
| 2-1 | 15.12 | 0 | 5.9 | 57,210 | 12.63 | 56,830 | 11.79 |
| 2-2 | 15.12 | 20 | 4.3 | 58,140 | 10.95 | 58,030 | 8.78 |
| 2-3 | 15.12 | 30 | 3.4 | 62,950 | 14.19 | 62,150 | 13.95 |
| 2-4 | 9 | 0 | 7.8 | 49,300 | 16.13 | 47,410 | 12.07 |
| 2-5 | 9 | 0 | 7.2 | 46,230 | 12.50 | 44,100 | 8.71 |
| 2-6 | 9 | 10 | 7.6 | 35,460 | 10.13 | 36,310 | 11.25 |
| 2-7 | 9 | 25 | 3.5 | 68,820 | 12.67 | 69,850 | 10.55 |

*Tensile strength and ductility characteristics are determined as specified in IPC-CF-150E From Table 2 it can be seen that the tensile strength and elongation characteristics of each foil is well above the minimum values set forth in Table 1 above for IPC Class 1 foil. Moreover, the roughnesses are quite low and in the case of runs 2-2, 2-3 and 2-7 are as low as typical shiny side roughnesses ($R_{tm}$) which range from about 3.5 to about 4.5 μm, and are lower than for raw 1 oz. IPC Class 1 low profile foil produced using only glue as a leveler which typically has an $R_{tm}$ roughness in the order of about 5.2 μm.

Thus, IPC Class 1 low profile foil may be produced, in accordance with the invention, without the need for decreasing current densities and without loss of metallurgical properties.

Additionally, since the roughness is initially so low and the elongation is so high current density may be increased to increase production. In such case the roughness will increase and the elongation may decrease; however, much greater production rates are achievable while still producing a acceptable Class 1 foil. An added benefit is that the already high tensile strength will be increased as the current density increases and the foil will thus achieve enhanced resistance to wrinkling.

In sum, for production of IPC Class 1 foils, the addition of thiourea to the electrolytic cell solution provides three separate and distinct advantages:

1. $R_{tm}$ roughness may be decreased to provide a Class 1 low profile foil;
2. Tensile strength may be increased and the modulus of elasticity also increased to provide a wrinkle resistant Class 1 foil; and
3. Higher current density may be used to increase production without concomitant loss of Class 1 properties.

EXAMPLE III

In this example a number of test runs were conducted using a production scale electroforming cell to investigate the production of IPC Class 3 foils using thiourea as an electrolytic bath solution additive. The tests were conducted using an EFC 10 as illustrated in FIG. 1. In each of these tests a 2 oz. foil was deposited. The current density was varied from 825 to 1100 ASF, the glue addition rate was varied from 0.3 mg/min.kA to 0.6 mg/min kA and the thiourea addition rate was varied between 0 and 5.0 mg/min.kA. The data collected are set forth in Table 3.

TABLE 3

| Run No. | Current Density ASF | Glue Addition Rate mg/min · kA | Thiourea Addition Rate mg/min · kA | Roughness ($R_{tm}$) μm | Room temperature (LD) characteristics* T.S. (psi) | Room temperature (LD) characteristics* % Elong | 180° Elevated temperature (TD) characteristics* T.S. (psi) | 180° Elevated temperature (TD) characteristics* % Elong |
|---|---|---|---|---|---|---|---|---|
| 3-1 | 825 | 0.3 | 0 | 14.74 | 50,450 | 25.36 | 30,630 | 6.03 |
| 3-2 | 825 | 0.3 | 5 | 11.17 | 39,460 | 35.60 | 23,630 | 14.02 |
| 3-3 | 917 | 0.3 | 4.5 | 10.08 | 40,050 | 35.89 | 22,690 | 12.36 |
| 3-4 | 917 | 0.3 | 4.5 | 10.97 | 40,680 | 35.91 | 22,720 | 12.32 |
| 3-5 | 917 | 0.3 | 4.05 | 11.07 | 40,910 | 36.24 | 22,590 | 11.51 |
| 3-6 | 1100 | 0.3 | 3.38 | 11.84 | 44,610 | 30.03 | 26,180 | 9.42 |
| 3-7 | 1100 | 0.3 | 3.38 | 12.34 | 44,490 | 30.89 | 23,880 | 9.20 |
| 3-8 | 1100 | 0.3 | 1.69 | 14.28 | 42,290 | 32.20 | 23,310 | 10.42 |
| 3-9 | 917 | 0.3 | 2.03 | 13.32 | 39,480 | 36.70 | 21,370 | 12.31 |
| 3-10 | 917 | 0.4 | 4.05 | 11.56 | 38,790 | 35.48 | 23,990 | 15.97 |
| 3-11 | 917 | 0.6 | 3.5 | 11.04 | 38,290 | 36.55 | 22,950 | 12.72 |
| 3-12 | 917 | 0.6 | 3.5 | 11.09 | 41,190 | 35.80 | 22,430 | 12.93 |
| 3-13 | 917 | 0.6 | 3.5 | 10.51 | 40,290 | 36.94 | 22,870 | 9.74 |
| 3-14 | 1100 | 0.6 | 3.38 | 13.14 | 44,230 | 31.49 | 25,560 | 5.23 |
| 3-15 | 917 | 0.6 | 0 | 16.67 | 49,320 | 24.23 | 29,490 | 4.83 |

*Tensile strength and ductility characteristics are determined as specified in IPC-CF-150E

EXAMPLE IV

In this example a number of test runs were conducted using a production scale electroforming cell. Again the system was set up like the system of FIG. 1. The tests were designed to produce IPC Class 3 foil using thiourea as a bath additive. In each of these tests the glue addition rate was 0.53 mg/min.kA and a 2 oz. foil was electrodeposited. The current density was either 733 ASF or 1100 ASF and the thiourea addition rate was varied between 0 and 30 mg/min.kA. The data collected are set forth in Table 4.

TABLE 4

| Run No. | Current Density ASF | Thiourea Addition Rate mg/min · kA | Roughness ($R_{tm}$) μm | Room temperature (TD) characteristics* T.S. (psi) | Room temperature (TD) characteristics* % Elong |
|---|---|---|---|---|---|
| 4-1 | 733 | 0 | 14.49 | 30,220 | 5.80 |
| 4-2 | 1100 | 0 | too rough to measure | 29,720 | 4.80 |
| 4-3 | 733 | 9.3 | 8.59 | 24,140 | 13.83 |
| 4-4 | 733 | 9.3 | 8.96 | 23,980 | 13.15 |
| 4-5 | 733 | 27.9 | 9.38 | 24,010 | 11.75 |
| 4-6 | 733 | 27.9 | 10.37 | 25,350 | 10.52 |
| 4-7 | 1100 | 10 | 11.28 | 29,060 | 3.86 |
| 4-8 | 1100 | 10 | 12.18 | 29,150 | 4.55 |
| 4-9 | 1100 | 30 | 9.46 | 29,440 | 5.96 |
| 4-10 | 1100 | 30 | 9.39 | 30,750 | 6.39 |
| 4-11 | 1100 | 10 | 13.27 | 26,250 | 3.22 |

*Tensile strength and ductility characteristics are determined as specified in IPC-CF-150E With reference to Tables 3 and 4 it can be seen that the tensile strength and elongation characteristics of each foil is well above the minimum values set forth in the IPC Table presented above for Class 3 foils. Moreover, the roughnesses of the foils produced with thiourea added to the electrolyte solution are much lower than the roughnesses of the foils produced without thiourea addition. With reference to Tables 3 and 4 it can be seen when thiourea is added to the electrolyte solution Class 3 foils are produced at high current densities.

For production of IPC Class 3 foils, the addition of thiourea to the electrolytic cell solution offers three separate and distinct advantages:

1. $R_{tm}$ roughness may be decreased to provide a Class 3 low profile foil;
2. Elongation may be increased to provide an improved Class 3 foil; and
3. Higher current density may be used to increase production without concomitant loss of Class 3 properties.

As a preferred embodiment, IPC Class 3 2 oz. foil may be produced in an EFC 10 as depicted in FIG. 1 as follows:

| | |
|---|---|
| Current Density: | 1100 ASF |
| Glue Rate: | 0.35 mg/min · kA |
| Thiourea Rate: | 5 mg/min · kA |
| $R_{tm}$ Roughness: | 11 to 12 μm |
| 180° Tensile Strength: | 28,000 to 30,000 psi |
| 180° Elongation: | 4 to 6% |

We claim:
1. A process for electrolytically forming copper foil for use in printed circuit board applications comprising:
   A) providing an electrolyte solution containing copper ions and sulfate ions wherein said electrolyte solution has immersed therein an anode and a cathode;
   B) continuously supplying to said electrolyte solution a quantity of a gelatin component consisting essentially of high-protein polymers of amino acids linked by peptide chains having molecular weights in the range of from about 10,000 to about 300,000 and a quantity of an active sulfur containing component having a bivalent sulfur atom wherein both bonds of which are directly connected to a carbon atom together with one or more nitrogen atoms also directly connected to the carbon atom wherein said quantities are sufficient to produce an IPC-CF-150E Class 1 copper foil; and
   C) applying a voltage across said anode and cathode immersed in said electrolyte solution to thereby cause the electrodeposition of a Class 1 copper foil at said cathode.
2. A process for electrolytically forming copper foil for use in printed circuit board applications comprising:
   A) providing an electrolyte solution containing copper ions and sulfate ions wherein said electrolyte solution has immersed therein an anode and a cathode;
   B) continuously supplying to said electrolyte solution a quantity of a gelatin component consisting essentially of high-protein polymers of amino acids linked by peptide chains having molecular weights in the range of from about 10,000 to about 300,000 and a quantity of an active sulfur containing component having a bivalent sulfur atom wherein both bonds of which are directly connected to a carbon atom together with one or more nitrogen atoms also directly connected to the carbon atom wherein said quantities are sufficient to produce an IPC-CF-150E Class 3 copper foil; and C) applying a voltage across said anode and cathode immersed in said electrolyte solution to thereby cause the electrodeposition of a Class 3 copper foil at said cathode.

3. The process as set forth in claim 1, wherein said quantity of said active sulphur containing component is sufficient for decreasing the roughness of a 1 oz. electrodeposited copper foil to an $R_{tm}$ of less than about 5.0.

4. The process as set forth in claim 1, wherein said quantity of said active sulphur containing component is sufficient for increasing the tensile strength of the electrodeposited foil.

5. The process as set forth in claim 1, wherein said quantity of said active sulphur containing component is sufficient to enable increasing the current for electrolytically forming said copper foil to greater than about 500 ASF without substantially altering the basic characteristics of the foil.

6. The process as set forth in claim 5, wherein said quantity of said active sulphur containing component is sufficient to enable increasing said current from about 500 ASF to about 1500 ASF without substantially altering the basic characteristics of the foil.

7. The process as set forth in claim 2, wherein said quantity of gelatine component is present in an amount sufficient to facilitate the production of an IPC Class 3 foil and said quantity of said active sulphur containing component is sufficient for decreasing the roughness of a 1 oz. electrodeposited IPC Class 3 foil to an $R_{tm}$ of less than about 7.0.

8. The process as set forth in claim 7, wherein said quantity of said gelatine component is present in an amount sufficient to facilitate the production of an IPC Class 3 foil and said quantity of said active sulphur containing component is sufficient to enable increasing the current for electrolytically forming said copper foil to greater than about 500 ASF without substantially altering the basic Class 3 characteristics of the foil.

9. The process as set forth in claim 8, wherein said quantity of said active sulphur containing component is sufficient to enable increasing said current from about 500 ASF to about 1500 ASF without substantially altering the basic characteristics of the foil.

10. The process as set forth in claim 1, wherein said gelatine component comprises animal glue.

11. The process as set forth in claim 10, wherein said active sulphur containing component comprises thiourea.

12. The process as set forth in claim 11, wherein said animal glue is added to said solution at a rate in the range of from about 0.2 mg/min.kA to about 20 mg/min.kA and said thiourea is added to said solution at a rate in the range of from about 1.25 mg/min.kA to about 50 mg/min.kA.

13. The process as set forth in claim 11, wherein said animal glue is added to said solution at a rate in the range of from about 5 mg/min.kA to about 20 mg/min.kA and said thiourea is added to said solution at a rate in the range of from about 10 mg/min.kA to about 50 mg/min.kA.

14. The process as set forth in claim 11, wherein said animal glue is added to said solution at a rate in the range of from about 8 mg/min.kA to about 10 mg/min.kA and said thiourea is added to said solution at a rate in the range of from about 20 mg/min.kA to about 30 mg/min.kA.

15. The process as set forth in claim 2, wherein said gelatine component is animal glue and is added to said solution at a rate less than about 5 mg/min.kA and said active sulfur component is thiourea and is added to said solution at a rate less than about 10 mg/min.kA.

16. The process as set forth in claim 15, wherein said animal glue is added to said solution at a rate of about 0.3 mg/min.kA and said thiourea is added to said solution at a rate of about 5 mg/min.kA.

17. An electrolytic bath for electrodepositing copper foil for printed circuit board applications comprising an aqueous solution containing copper ions, sulphate ions, a quantity of a gelatine component consisting essentially of high protein polymers of amino acids linked by peptide chains having molecular weights in the range of from about 10,000 to about 300,000 and a roughness decreasing quantity of an active sulphur containing component having a bivalent sulfur atom wherein both bonds of which are directly connected to a carbon atom together with one or more nitrogen atoms also connected to the carbon atom wherein said quantities are sufficient to produce an IPC-CF-150E Class 1 or Class 3 copper foil.

18. An electrolytic bath as set forth in claim 17, wherein said active sulphur containing component is thiourea.

19. An electrolytic bath as set forth in claim 17, wherein said gelatine component is animal glue.

20. An electrolytic bath as set forth in claim 19, wherein said animal glue is present in an amount ranging from about 0.044 ppm to about 4.4 ppm.

21. An electrolytic bath as set forth in claim 18, wherein said quantity of thiourea present in said bath ranges from about 0.28 ppm to about 11.1 ppm.

22. A 2 oz. copper foil as set forth in claim 17 having a tensile strength of at least 25,000 psi and an elongation of greater than 5% as measured at 180° C.

23. A copper foil as set forth in claim 17, wherein said foil is electrolytically deposited at a current density of 1100 ASF.

24. A copper foil as set forth in claim 17 having a tensile strength of at least 65,000 psi and an elongation of greater than 12% as measured at room temperature.

25. A 2 oz. copper foil for printed circuit board applications having IPC-CF-150E Class 1 properties and an $R_{tm}$ of less than about 8.0 μm.

26. A 1 oz. copper foil for printed circuit applications having IPC-CF-150E Class 1 properties and an $R_{tm}$ of less than about 5 μm.

27. A ½ oz. copper foil for printed circuit board applications having IPC-CF-150E Class 1 properties and an $R_{tm}$ of less than about 4.6 μm.

28. A low profile copper foil for printed circuit board applications having IPC-CF-150E Class 3 properties.

29. A 2 oz. copper foil for printed circuit board applications having IPC-CF-150E Class 3 properties and an $R_{tm}$ of less than about 11 μm.

30. A 1 oz. copper foil for printed circuit board applications having IPC-CF-150E Class 3 properties and an $R_{tm}$ of less than about 7 μm.

31. A ½ oz. copper foil for printed circuit board applications having IPC-CF-150E Class 3 properties and an $R_{tm}$ of less than about 5 μm.

* * * * *